United States Patent

McDonald et al.

[11] Patent Number: 6,091,658
[45] Date of Patent: Jul. 18, 2000

[54] NONVOLATILE MEMORY IMPLEMENTATION FOR ELECTRONIC DEVICES

[75] Inventors: John Robert McDonald, Livonia; John Lowell Zeller, Farmington Hills; Thomas Scott Gee, Canton, all of Mich.

[73] Assignee: Ford Global Technologies, Inc., Dearborn, Mich.

[21] Appl. No.: 09/430,897

[22] Filed: Nov. 1, 1999

[51] Int. Cl.$^7$ ..................................................... G11C 7/00
[52] U.S. Cl. ................... 365/228; 365/226; 365/189.06; 371/21.1; 371/21.2; 371/40.11; 371/40.4; 371/67.1
[58] Field of Search ........................ 365/230.01, 189.01, 365/189.06, 226, 228; 371/21.1, 21.2, 40.1, 40.4, 67.1

[56] References Cited

U.S. PATENT DOCUMENTS

| | | |
|---|---|---|
| 4,651,307 | 3/1987 | Toumayan et al. . |
| 4,787,040 | 11/1988 | Ames et al. .......................... 364/424.01 |
| 4,959,774 | 9/1990 | Davis . |
| 5,195,100 | 3/1993 | Katz et al. . |
| 5,283,907 | 2/1994 | Bräuninger . |
| 5,454,099 | 9/1995 | Myers et al. . |
| 5,499,181 | 3/1996 | Smith ................................... 364/424.04 |
| 5,533,123 | 7/1996 | Force et al. .................................. 380/4 |
| 5,784,548 | 7/1998 | Liong et al. . |
| 5,831,905 | 11/1998 | Hirano ................. 365/185.29 |
| 5,884,211 | 3/1999 | Pauli et al. . |

*Primary Examiner*—Viet Q. Nguyen
*Attorney, Agent, or Firm*—Mark S. Sparschu

[57] ABSTRACT

An automobile has an electronic device with a nonvolatile memory implementation. The electronic device includes non-programmable nonvolatile memory (ROM), volatile memory (RAM) and programmable nonvolatile memory (EEPROM). A controller (CPU) is coupled to and controls reads and writes to and from the ROM, RAM, and EEPROM. When the CPU detects a key-off event it calculates an error recovery code (checksum) for a data string stored in the RAM and stores the checksum and data into one of two memory locations in the EEPROM. The CPU will alternate between the two memory locations each cycle. When the CPU detects a key-on event it calculates the checksum for the data string stored in the RAM. If the data string is invalid or if validity of the EEPROM data cannot be confirmed, then the CPU copies a predetermined data string from the ROM to the RAM. If the CPU determines that the calculated KAM checksum does not equal the stored KAM checksum, then the CPU copies the EEPROM data string to the KAM. Otherwise, the RAM data string remains untouched.

20 Claims, 3 Drawing Sheets

NONVOLATILE MEMORY IMPLEMENTATION FOR ELECTRONIC DEVICES

TECHNICAL FIELD

The present invention relates generally to electronic data storage and, more particularly, to a nonvolatile memory implementation for electronic devices.

BACKGROUND ART

Microprocessor control has afforded many advantages to many applications, particularly vehicle control. As microprocessors continue to become more sophisticated, additional features may be added to enhance control of the vehicle. In addition, an increasing number of vehicle accessories are controlled by microprocessors to customize the vehicle environment for one or more occupants. For example, power seats, power mirrors, stereo systems, and the like, may be controlled by microprocessors and include memory to store preferences for one or more users, such as radio station presets, or seat or mirror positions.

Microprocessor-based controllers are often given generic names to describe their function. For example, an engine control module (ECM) is used to control the engine, a transmission control module (TCM) is used to control an automatic transmission, and anti-lock braking system (ABS) controller may be used to control the vehicle brakes. As controllers become more sophisticated, various functions may be combined or integrated into a single controller. For example, a powertrain control module (PCM) may be used to control the engine and transmission. Similarly, a vehicle control module (VCM) may be used to control the engine, transmission, active suspension, power steering, ABS, and the like. The various controllers use permanent/non-volatile and temporary/volatile memory to store control parameter values and control logic to effect control over the various systems. Many systems now use adaptive control parameters that change over time to respond to changing system dynamics. For example, engine idle speed control (ISC) or fuel control parameters may be used to implement an adaptive control strategy to adjust for changes that occur due to wear of various engine components. Adaptive control parameters may be used in an active suspension system to adjust for the change in frequency response of the suspension components or to adapt to a particular vehicle loading. An automatic transmission may use adaptive control parameters to maintain consistent shift quality as various friction components wear or transmission fluid characteristics change.

In addition to adaptive control parameters, real-time controllers continually calculate and update variables based on the current operating conditions of the vehicle. These variables are typically stored in temporary memory such as RAM. As such, when the vehicle ignition is turned off, the values of these variables are lost. In contrast, it is often desirable to maintain the values for adaptive control parameters from one engine start to the next because they are typically slowly varying parameters that are set to a nominal value during manufacturing and then adjusted over the life of the vehicle. As such, these types of variables are often stored in a more permanent type of memory, generically referred to as keep-alive memory (KAM). The keep-alive memory allows modification of the parameter values and is not generally reset when the engine is stopped and the ignition key turned off. KAM is typically achieved by keeping the RAM powered during key-off. KAM is a designated portion of RAM.

Unfortunately, keep-alive memory has several drawbacks. Keep-alive memory depends on battery power to be continuously above a threshold (typically five volts) in order for RAM to retain its memory. This is a problem during low battery conditions such as cold weather engine cranking, battery disconnects, and battery failures. Also, if the CPU shuts down (due to key-off) during a write to the RAM the contents of the keep-alive memory can be corrupted.

To get around the drawbacks of keep-alive memory, some electronic devices use an EEPROM device in combination with a power sustain circuit to store important values. The power sustain circuit is typically circuitry in the electronic device that keeps the CPU and EEPROM devices powered through a direct (fused) connection to the battery until the CPU has completed writing the necessary information to the EEPROM device. Once the write is complete, the power sustain control circuit releases power to the CPU. Unfortunately, using an EEPROM device also has several drawbacks. If battery voltage drops below a threshold during the write operation, the in the EEPROM device will be corrupted. This can lead to "no start" conditions. This condition can only be remedied by replacing the electronic module or reinitializing the EEPROM device (EEPROM reinitialization is not typically something done in the field). Further, there are times during vehicle servicing that stored this data needs to be ignored or reset to base values. One example would be resetting learned fuel correction tables after a fuel injection, or fuel pump, or airflow sensor was replaced.

Thus, there exists a need to improve nonvolatile memory implementation for electronic devices to ensure valid memory is retained.

SUMMARY OF THE INVENTION

It is an object of the invention to provide an improved and reliable means for nonvolatile memory implementation for electronic devices. Another object of the invention is to prevent electronic data corruption yet allow a means for a field technician to reset the memory in the field.

In one aspect of the invention, an automobile has an electronic device with a nonvolatile memory implementation. The electronic device includes non-programmable nonvolatile memory (ROM), volatile memory (RAM) and programmable nonvolatile memory (EEPROM). A controller (CPU) is coupled to and controls reads and writes to and from the ROM, RAM, and EEPROM. When the CPU detects a key-off event it calculates an error recovery code (checksum) for a data string stored in the KAM and stores the checksum and data into one of two memory locations in the EEPROM and into KAM. The CPU will alternate between the two memory locations each cycle. When the CPU detects a key-on event it calculates the checksum for the data string stored in the RAM and also compares the contents of 3 locations of KAM against expected values. If the contents of all 3 KAM locations are different than expected values, then the CPU copies a predetermined data string from the ROM to the KAM. If the CPU determines that the calculated KAM checksum does not equal the stored KAM checksum, then the CPU copies the appropriate EEPROM data string to the RAM overwriting the existing KAM data. Otherwise, the KAM data string remains untouched.

The present invention achieves an improved and reliable means for nonvolatile memory implementation for electronic devices. Also, the present invention is advantageous in that it prevents the corruption of electronic data.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to She accompanying drawings, in which.

BEST MODE(S) FOR CARRYING OUT THE INVENTION

Figure 1:
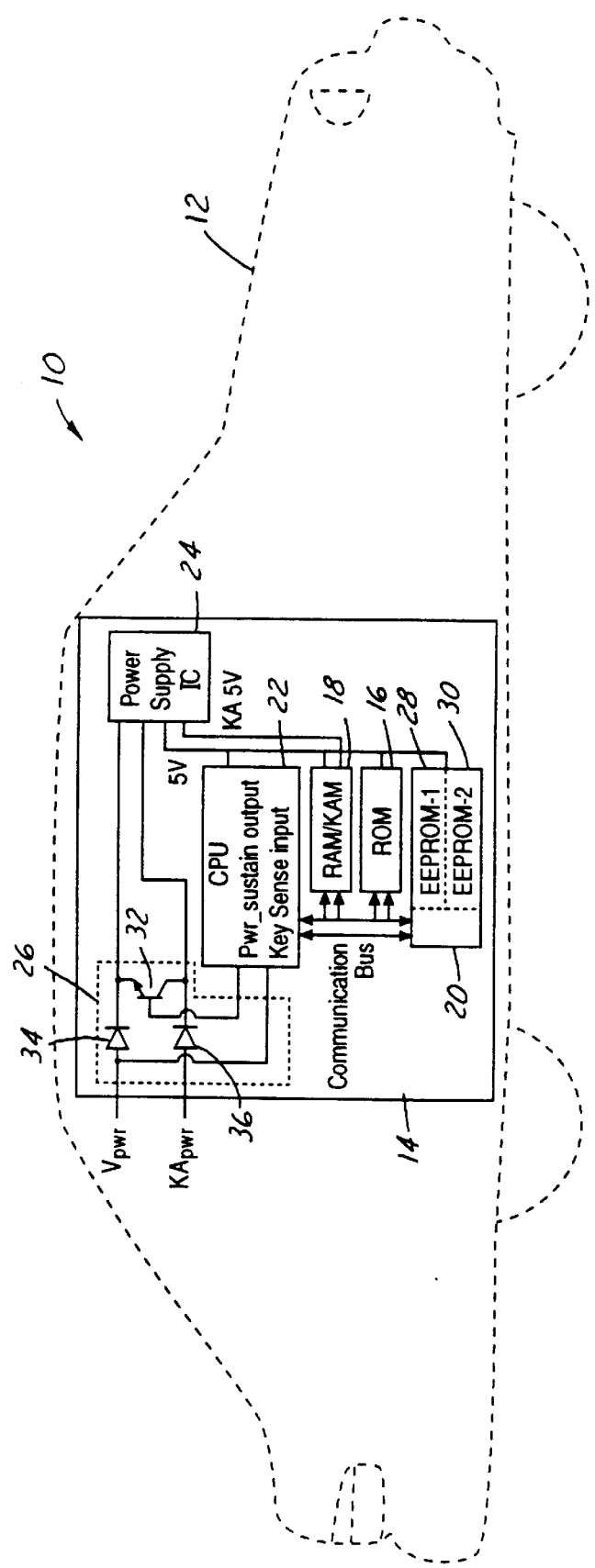
FIG. 1 is a block diagram of an automotive electronic system in accordance with one embodiment of the present invention.

Referring to FIG. 1, a block diagram of an automotive electronic system 10 in accordance with one embodiment of the present invention is illustrated. The automotive electronic system 10 is comprised of an automobile 12 having at least one electronic device 14. Electronic device 14 includes a non-programmable nonvolatile memory device 16, a volatile memory device 18, a programmable nonvolatile memory device 20, a controller 22, a power supply device 24, and a power sustain circuit 26.

The three types of memory used by electronic device 14 each have unique characteristics. Non-programmable nonvolatile memory device 16 is used to store a predetermined data string. The data stored in non-programmable nonvolatile memory device 16 can only be read by controller 22 and is relatively permanent, i.e., loss of power does not effect the stored data. Because of the relative permanence of the data stored in device 16 the predetermined data string can be used when electronic device 14 is initialized for the first time or in the event of unexpected data loss. In the present embodiment, a read only memory (ROM) device is used.

Programmable volatile memory device 18 is used to store a first data string and a first error recovery code in a first memory location. The data stored in programmable volatile memory device 18 can be read or written with relative ease and is not permanent, i.e., loss of power will result in loss of the stored data. However, because of the relative ease with which data can be stored and recalled, device 18 is used extensively during the normal operation of electronic device 14 for data storage and manipulation. In the present embodiment, a random access memory (RAM) device is used. In order to maintain the data in RAM 18, constant voltage, or keep-alive voltage, is supplied to electronic device 14 and specifically to the RAM device. Because of this, a portion of RAM 18 may be called keep-alive memory, or KAM.

Programmable nonvolatile memory device 20 is used to store a second data string in a second memory location 28 and a third data string in a third memory location 30. The data stored in programmable nonvolatile memory device 20 can be read or written slower then RAM 18 and is relatively permanent, i.e., loss of power will not result in loss of the stored data. The relative permanence of the data and the fact that data can be stored and recalled allows device 20 to be used for permanent storage of transient data in electronic device 14. In the present embodiment, an electrically erasable programmable read only memory (EEPROM) is used.

Controller 22 is coupled to and controls the data flow and operation of ROM 16, RAM 18, power sustain circuit 26, and EEPROM 20. Controller 22 has control logic operative to calculate an error recovery code and read and write data between the above memory devices 16, 18, and 20 in response to a key-on event or a key-off event. In an automobile, a key-on event occurs when an operator turns a key to an 'on' position, while a key-off event occurs when the operator turns the key to an 'off' position. The operation of controller 22 will be described in further detail below. One skilled in the art would recognize that the error recovery code might be any numeric function capable of error recovery such as checksum, CRC or similar. In the present invention, controller 22 calculates a checksum.

Power supply device 24 supplies power to controller 22 and memory devices 16, 18, and 20. Power supply device 24 is also coupled to a power sustain circuit 26. Power sustain circuit 26 is responsible for supplying key-on voltage ($V_{pwr}$) and keep-alive voltage. Key-on voltage is only present during a key-on event, while keep-alive voltage is fused directly to a battery. Power sustain circuit 26 maintains voltage to power supply device 24 during a key-off event until controller 22 has completed copying data to EEPROM 20. In the present embodiment, a transistor 32 is coupled between Key-on voltage $V_{pwr}$ and Keep-alive voltage $KA_{pwr}$. Transistor 32 is held on by controller 22 during a key-off event until it has completed copying data to EEPROM 20. To prevent voltage feedback outside of electronic device 14, diodes 34 and 36 are coupled between Key-on voltage $V_{pwr}$ and transistor 32 and Keep-alive voltage $KA_{pwr}$ and transistor 32.

Figure 2:
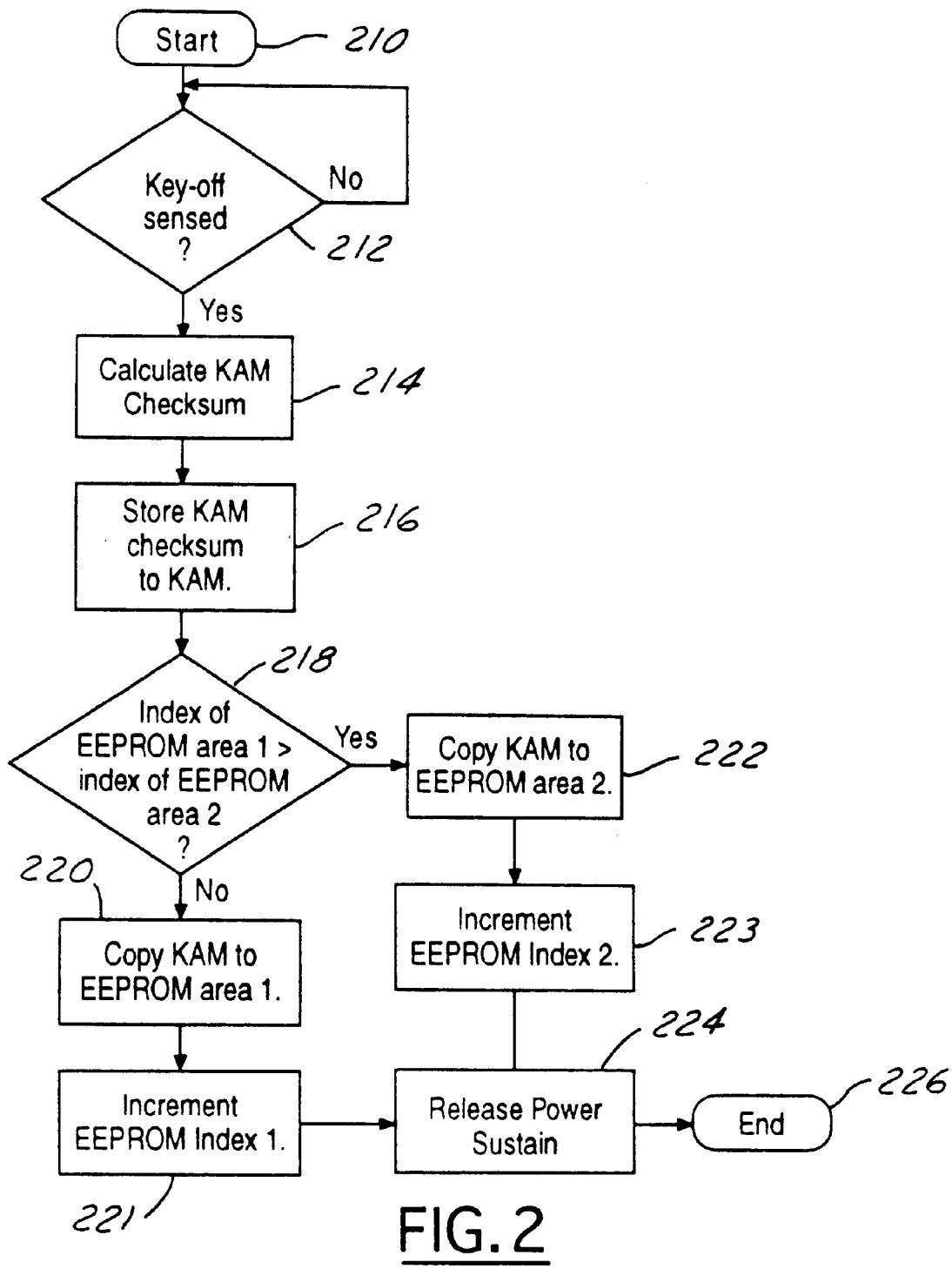
FIG. 2 is a flow chart depicting a keyoff algorithm for a nonvolatile memory implementation in accordance with one embodiment of the present invention.

Referring to FIG. 2, a flow chart depicting a key-off algorithm for a nonvolatile memory implementation in accordance with one embodiment of the present invention is illustrated. In operation, the key-off algorithm begins with step 210 an proceeds immediately to step 212. In step 212, controller 22 determines if there has been a key-off event. If controller 22 determines that there has been a key-off event, then the sequence proceeds to step 214. If controller 22 determines that there has not been a key-off event, then the sequence returns to step 210.

In step 214, controller 22 calculates a first error recovery code (checksum) of a first data string stored in a first memory location in KAM 18. The sequence then proceeds to step 216 where the first error recovery code (checksum) is stored with the first data string in the first memory location in KAM 18. The sequence then proceeds to step 218.

In step 218, controller 22 determines which memory location in EEPROM 20 should receive a copy of the first data string. The controller will copy the first data sting and the first error correction code alternatively to a second memory location 28 and a third memory location 30. The second memory location 28 will receive the data if the third memory location 30 was the last location to receive a copy. Otherwise, the third memory location 30 will receive the data.

One method for determining which memory location should receive the data involves associating an index bit to each memory area. As each memory area is written to, the index bit associated with the memory area is incremented. In this way, all the controller needs to do is determine if the index bit of the second memory location 28 is greater than the index bit of the third memory location 30 to determine which memory location will receive the data. By incrementing the index register for a given EEPROM area immediately after the data string is written ensures that partial or incomplete write operations are not misinterpreted as valid data strings.

If the controller determines that the second memory location should receive the first data string and the first error code, then the sequence proceeds to step 220 and the data is stored in second memory location 28. Otherwise, the sequence proceeds to step 222 where the data is stored in third memory location 30. The sequence then proceeds to step 224 where controller 22 releases the power sustain circuit and the sequence ends with step 226.

Figure 3:
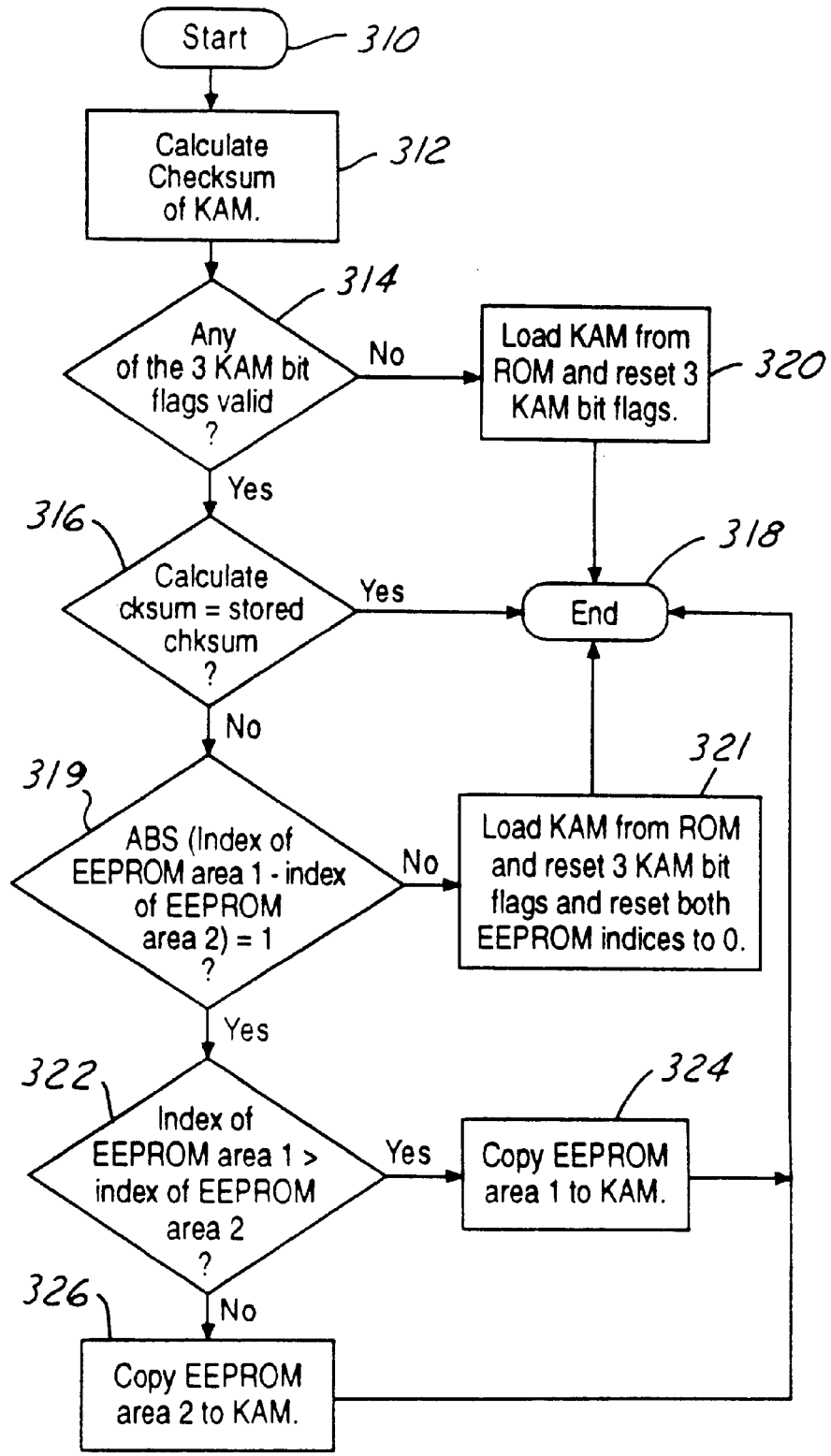
FIG. 3 is a flow chart depicting a key-on algorithm for a nonvolatile memory implementation in accordance with one embodiment of the present invention.

Referring to FIG. 3, a flow chart depicting a key-on algorithm for a nonvolatile memory implementation in accordance with one embodiment of the present invention is illustrated. In operation, the key-on algorithm begins with step 310 and proceeds immediately to step 312. In step 312, controller 22 calculates a second error recovery code (checksum) for the first data string stored in the first memory location in KAM 18. The sequence then proceeds to step 314 where the controller determines if any of 3 independent KAM locations are valid, all three of these locations can only become invalid if $KA_{pwr}$ to the electronic device 14 is removed for extended periods of time or if massive corruption of KAM occurs. If all three independent KAM locations are invalid, then controller 22 copies a predetermined data string from ROM 16 into the first memory location and the sequence ends with step 318. Otherwise the sequence proceeds to step 316.

In step 316, the controller determines if the first error correction code of the first data string stored in KAM 18 is equal to the calculate correction code from step 312. If the first error correction code stored in KAM 18 is equal to calculated error correction code, then the sequence ends with step 318. Otherwise the sequence proceeds to step 319.

In step 319, controller 22 determines if the absolute value of the difference between the two EEPROM 20 indices is equal to 1. This is a rationality check of the data in the EEPROM 20. If not equal to one, the controller determines the EEPROM 20 data is unreliable and resets KAM to values pre-determined by ROM, the 3 independent KAM registers are set to pre-determined values, and the EEPROM 20 indices are both reset to zero in block 321. The sequence then proceeds to the end in block 318. If the output of block 319 is "yes", control moves to block 322.

In step 322, controller 22 determines which memory location in EEPROM 20 a second data string should be copied from to a first memory location in KAM 18. The controller will copy the second data sting alternatively from a second memory location 28 and a third memory location 30. The second memory location 28 will provide the data if it was the last location to receive a copy. Otherwise, the third memory location 30 will provide the data.

One method for determining which memory location should provide the data involves associating an index register to each memory area. As each EEPROM 20 area is written to, the index register associated with the EEPROM 20area is incremented. In this way, all the controller needs to do is determine if the index register of the second memory location 28 is greater than the index bit of the third memory location 30 to determine which memory location will receive the data.

If the controller determines that the second memory location should provide the second data string, then the sequence proceeds to step 324 and the second data string is copied from second memory location 28 to the first memory location KAM 18. Otherwise, the sequence proceeds to step 326 where the second data string is copied from the third memory location to the first memory location. The sequence then ends with step 318.

From the foregoing, it can be seen that there has been brought to the art a new and improved nonvolatile memory implementation for electronic devices. It is to be understood that the preceding description of the preferred embodiment is merely illustrative of some of the many specific embodiments that represent applications of the principles of the present invention. Clearly, numerous and other arrangements would be evident to those skilled in the art without departing from the scope of the invention as defined by the following claims:

What is claimed is:

1. An electronic device, comprising;
a volatile memory device having a first memory location for storing a first data string;
a programmable first nonvolatile memory device having a second memory location for storing a second data string and a third memory location for storing said second data string; and
a controller coupled to said volatile memory device and said programmable nonvolatile memory device, said controller having control logic operative to alternatively copy said first data string between said second memory location and said third memory location during an impending power-down event; compare said first data string's calculated checksum to the stored checksum in the first memory device during a power-up event; alternatively copy said second data string from said second or third memory location to said first memory location when said first data string's checksum does not equal the stored checksum for the second data string; copy said predetermined data string to said first memory location during an error event.

2. A device as recited in claim 1, further comprising a second nonvolatile memory device having a predetermined data string and wherein said controller further has control logic operative to copy said predetermined data string to said first memory location during an error event.

3. A device as recited in claim 2, further comprising a power supply device coupled to a first voltage source and supplying power for said controller, said volatile memory device and said programable first memory device.

4. A device as recited in claim 3, further comprising a power sustain circuit coupled to said first voltage source and a second voltage source, said power sustain circuit coupled to and supplying power for said power supply device and controlled by said controller.

5. A device as recited in claim 4, wherein said first voltage source is a key-on voltage source and said second voltage source is a keep-alive voltage source.

6. A device as recited in claim 5 wherein a transistor is coupled between said key-on voltage source and said keep-alive voltage source, said transistor coupled to and controlled by said controller in response to the loss of said key-on voltage whereby said key-on voltage is supplied by said keep-alive voltage through said transistor.

7. A device as recited in claim 6 wherein a first diode is coupled between said key-on voltage source and said transistor and a second diode is coupled between said keep-alive voltage and said transistor.

8. A device as recited in claim 1 wherein said volatile memory is RAM/KAM, and said programmable nonvolatile memory device is EEPROM.

9. A device as recited in claim 1 wherein said controller calculates an error recovery code for said first data string and stores said error recovery code in said first memory location as separate of said first data string.

10. A device as recited in claim 9 wherein said error recovery code is a checksum of said first data string.

11. An automotive electronic system, comprising:

an automobile having an electronic function;

an electronic device located in said automobile and controlling said electronic function, said electronic device comprising;
- a non-programmable nonvolatile memory device having a predetermined data string;
- a volatile memory device having a first memory location for storing a first data string;
- a programmable nonvolatile memory device having a second memory location for storing a second data string and a third memory location for storing a third data string;
- a controller coupled to said volatile memory device and said programmable nonvolatile memory device, said controller having control logic operative to alternatively copy said first data string between said second memory location and said third memory location during a key-off event; compare said first data string's calculated error recovery code to said first data string's stored error recovery code during a key-on event; alternatively copy said second data string from said second or third memory location to said first memory location when said first data string's calculated error recover code does not equal said first data string's stored error recover code; copy said predetermined data string to said first memory location during an error event;
- a power supply device coupled to a first voltage source and supplying power for said controller, said volatile memory device and said nonvolatile memory device; and
- a power sustain circuit coupled to said first voltage source and a second voltage source, said power sustain circuit coupled to and supplying power for said power supply device and controlled by said controller.

12. A device as recited in claim 11, wherein said first voltage source is a key-on voltage source and said second voltage source is a keep-alive voltage source.

13. A device as recited in claim 12 wherein a transistor is coupled between said key-on voltage source and said keep-alive voltage source, said transistor coupled to and controlled by said controller in response to the loss of said key-on voltage whereby said key-on voltage is supplied by said keep-alive voltage through said transistor.

14. A device as recited in claim 13 wherein a first diode is coupled between said key-on voltage source and said transistor and a second diode is coupled between said keep-alive voltage and said transistor.

15. A device as recited in claim 11 wherein said non-programmable nonvolatile memory device is ROM, said volatile memory is RAM, and said programmable nonvolatile memory device is EEPROM.

16. A device as recited in claim 11 wherein said controller calculates an error recovery code for said first data string and stores said error recovery code in said first memory location separately from said first data string.

17. A device as recited in claim 16 wherein said error recovery code is a checksum of said first data string.

18. A method of providing non-volatile memory for an electronic device, said method comprising the steps of:

sensing an impending power-down event;

calculating a first error recovery code of a first data string stored in a first memory location;

storing said first error recovery code separately from said first data string in said first memory location;

alternatively copying said first error recovery code and said first data string between a second memory location and a, wherein said second and third memory location include corresponding indices;

releasing a power sustain circuit to turn off said electronic device;

sensing a power-upevent;

calculating a second error recovery code of said first data string stored in said first memory location;

writing a predetermined data string to said first memory location if said first memory location is determined to be completely invalid;

comparing said second error recovery code with said first error recovery code;

determining if said second memory location or said third memory location have valid data; and alternatively copying a second data string from said second memory location and said third memory location to said first memory location.

19. The method as recited in claim 18 further wherein the step of calculating a first error recovery code comprises calculating a first checksum of said first data string.

20. The method as recited in claim 18 further wherein the step of determining validity of second and third memory locations by comparing indices of the second and third memory locations.

* * * * *